(12) United States Patent
Fujimoto (10) Patent No.: US 7,579,760 B2
(45) Date of Patent: Aug. 25, 2009

(54) VIBRATOR AND PRODUCTION METHOD THEREFOR

(75) Inventor: Katsumi Fujimoto, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/101,227

(22) Filed: Apr. 11, 2008

(65) Prior Publication Data
US 2008/0185939 A1 Aug. 7, 2008

Related U.S. Application Data

(63) Continuation of application No. PCT/JP2006/323086, filed on Nov. 20, 2006.

(30) Foreign Application Priority Data

Nov. 21, 2005 (JP) .............................. 2005-335439
Nov. 17, 2006 (JP) .............................. 2006-310882

(51) Int. Cl.
*H01L 41/08* (2006.01)

(52) U.S. Cl. ...................... 310/359; 310/366; 310/368

(58) Field of Classification Search ................. 310/358, 310/359, 366, 367, 370
See application file for complete search history.

(56) References Cited

U.S. PATENT DOCUMENTS

| | | | |
|---|---|---|---|
| 3,969,641 A * | 7/1976 | Oguchi et al. ............... 310/348 |
| 4,384,232 A * | 5/1983 | Debely ........................ 310/370 |
| 4,503,352 A * | 3/1985 | Inoue ........................... 310/359 |
| 4,678,956 A * | 7/1987 | Izukawa et al. ........ 310/323.06 |
| 4,692,654 A * | 9/1987 | Umemura et al. ........... 310/334 |
| 5,635,786 A | 6/1997 | Fujimoto et al. |
| 5,942,839 A * | 8/1999 | Ohnishi et al. ............... 310/359 |
| 7,348,716 B2 * | 3/2008 | Ogura et al. ................. 310/370 |

FOREIGN PATENT DOCUMENTS

JP 03-96807 A 4/1991

(Continued)

OTHER PUBLICATIONS

Official communication issued in the International Application No. PCT/JP2006/323086, mailed on Dec. 26, 2006.

*Primary Examiner*—Mark Budd
(74) *Attorney, Agent, or Firm*—Keating & Bennett, LLP (57) ABSTRACT

A vibrator includes a vibrating body having a substantially quadrangular prism shape and including four side surfaces extending in the longitudinal direction of the vibrating body. A common electrode is formed on substantially an entire surface of one of the side surfaces of the vibrating body. Split electrodes extend in the longitudinal direction on another side surface opposite to the side surface on which the common electrode is formed, and are spaced from each other in the width direction of the side surface on which the split electrodes are formed. In the vibrating body, a first polarized section is polarized in a direction from the side surfaces of the vibrating body that do not have an electrode disposed thereon, toward the split electrodes. A second polarized section is polarized in a direction from the side surfaces of the vibrating body that do not have an electrode disposed thereon, toward the common electrode. Thus, the vibrator does not include a joint layer, and is polarized in opposite directions in the thickness direction.

6 Claims, 11 Drawing Sheets

FOREIGN PATENT DOCUMENTS

| | | |
|---|---|---|
| JP | 08-68638 A | 3/1996 |
| JP | 08-178666 A | 7/1996 |
| JP | 11-83496 A | 3/1999 |
| JP | 11-94555 A | 4/1999 |
| JP | 2000-314629 A | 11/2000 |
| JP | 2001-21359 A | 1/2001 |

* cited by examiner

VIBRATOR AND PRODUCTION METHOD THEREFOR

BACKGROUND OF THE INVENTION

1. Field of the Invention

The present invention relates to a vibrator and a production method therefor, and more particularly, to a vibrator used in, for example, a piezoelectric vibrating gyroscope arranged to detect the angular velocity and a production method therefor.

2. Description of the Related Art

Figure 11A:
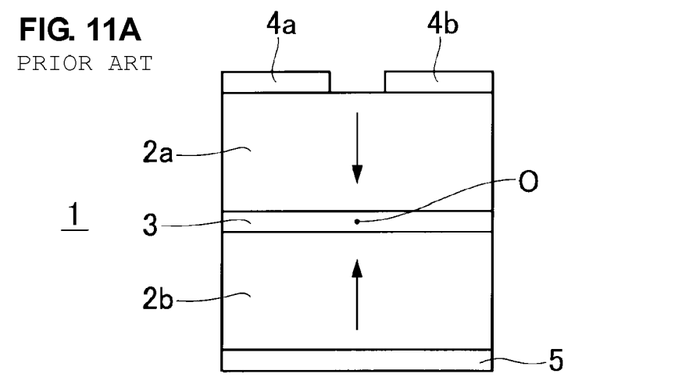
FIGS. 11A to 11C includes cross-sectional views illustrating known vibrators.
Figure 11B:
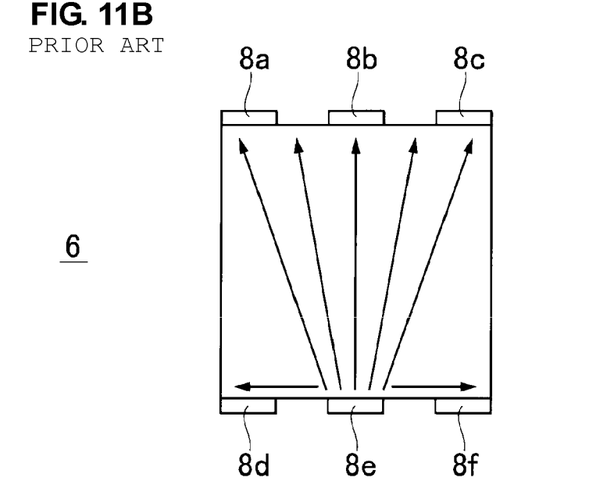
Figure 11C:
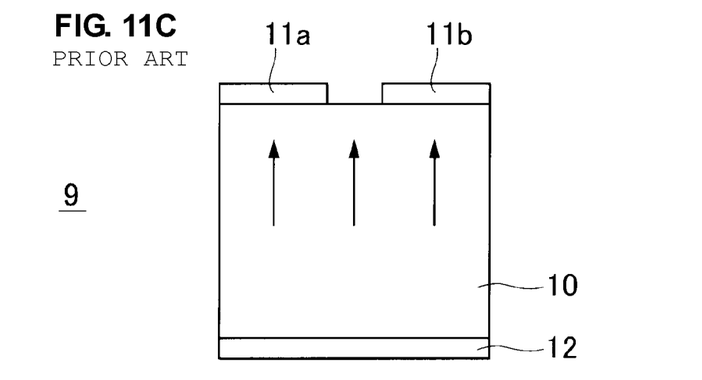

FIGS. 11A to 11C include cross-sectional views of known vibrators.

As shown in FIG. 11A, a vibrator 1 includes, for example, a first piezoelectric substrate 2a and a second piezoelectric substrate 2b. The first piezoelectric substrate 2a and the second piezoelectric substrate 2b are stacked with a joint layer 3 disposed therebetween. Further, the first piezoelectric substrate 2a and the second piezoelectric substrate 2b are polarized in opposite thickness directions, as shown by the arrows in FIG. 11A. Two split electrodes 4a and 4b are provided on a principal surface of the first piezoelectric substrate 2a so as to be spaced from each other in the width direction. A common electrode 5 is provided on a principal surface of the second piezoelectric substrate 2b (see Japanese Patent Application Publication No. H7-332988).

For example, the vibrator 1 is used in a piezoelectric vibrating gyroscope arranged to detect the angular velocity. A driving signal, such as a sinusoidal signal, is applied to the split electrodes 4a and 4b and the common electrode 5 in the vibrator 1. The driving signal causes the first piezoelectric substrate 2a and the second piezoelectric substrate 2b to be displaced in opposite directions. In this case, when the first piezoelectric substrate 2a expands in a direction parallel to the principal surface thereof, the second piezoelectric substrate 2b contracts in the direction parallel to the principal surface thereof. Conversely, when the first piezoelectric substrate 2a contracts in the direction parallel to the principal surface thereof, the second piezoelectric substrate 2b expands in the direction parallel to the principal surface thereof. For this reason, the first piezoelectric substrate 2a and the second piezoelectric substrate 2b bend in a direction substantially orthogonal to the principal surfaces thereof. When the vibrator 1 is rotated about a center axis O in this state, since different signals are output from the two split electrodes 4a and 4b, a signal corresponding to the angular velocity of rotation can be detected by detecting a difference between the output signals from the two split electrodes 4a and 4b. The angular rotation velocity can be determined from the output signal.

For this vibrator 1, a step of joining the two substrates is performed. The joining step reduces the production efficiency during mass production, and also causes variations in the characteristics among the vibrators. When the joint layer 3 is made of an organic adhesive, such as an epoxy adhesive, the adhesive also vibrates during excitation of the vibrator 1. Consequently, the detection efficiency of the angular velocity is reduced. Moreover, the vibration state changes with changes of the adhesive due to the temperature, and the detection sensitivity of the angular velocity varies.

Accordingly, a vibrator 6 shown in FIG. 11B is a vibrator which does not include a joint layer.

In the vibrator 6, electrodes 8a, 8b, 8c and electrodes 8d, 8e, and 8f are provided on opposite surfaces of a vibrating body 7 shaped, for example, like a quadrangular prism. The vibrating body 7 is polarized from the electrode 8e toward the electrodes 8a, 8b, and 8c, and is also polarized from the electrode 8e toward the electrodes 8d and 8f (see Japanese Patent Application Publication No. H11-83496).

A vibrator 9 shown in FIG. 11C is another vibrator which does not include a joint layer.

The vibrator 9 includes a vibrating body 10, shaped, for example, like a quadrangular prism, and two split electrodes 11a and 11b are provided on one principal surface so as to extend in the longitudinal direction and to be spaced from each other in the width direction. A common electrode 12 is provided on substantially the entire principal surface of the vibrating body 10 opposite to the surface on which the split electrodes 11a and 11b are provided. The vibrating body 10 is strongly polarized toward the split electrodes 11 and 11b on a side close to the surface including the split electrodes 11a and 11b, and is weakly polarized on a side close to the common electrode 12. This is obtained by heating one side of the vibrating body 10, which has been polarized in the thickness direction beforehand, to a temperature greater than or equal to the Curie point so as to weaken the polarization, and by cooling the other side so as to maintain the polarization (Japanese Patent Application Publication No. 2000-314629).

Since the above-described vibrators 6 and 9 do not include a joint layer, the problems of the related art resulting from the joint layer are not produced.

As described above, in the joint-type vibrator 1, since the step of joining the first piezoelectric substrate 2a and the second piezoelectric substrate 2b is performed, the production efficiency during mass production is reduced.

The vibrator 6 has a problem in that the electromechanical coefficient thereof is less than that of the joint-type vibrator 1. While the unimorph vibrator 9 has an electromechanical coefficient greater than that of the vibrator 6 in which the polarizing direction of a portion is changed, only one side of the vibrating body 10 in the thickness direction is displaced by the driving signal, and therefore, the obtained electromechanical coefficient is less than or equal to half the electromechanical coefficient of the joint-type vibrator 1.

In this manner, the joint-type vibrator has a problem of reduced production efficiency, and the vibrator having no joint layer has a problem of reduced electromechanical coefficient, that is, the exchange efficiency between electrical energy and mechanical energy is low.

SUMMARY OF THE INVENTION

To overcome the problems described above, preferred embodiments of the present invention provide a vibrator that achieves high production efficiency and provides a high electromechanical coefficient, and a production method for the vibrator.

A vibrator according to a preferred embodiment of the present invention includes a vibrating body having a substantially quadrangular prism shape and including four side surfaces extending in a longitudinal direction, a common electrode provided on substantially the entire surface of one of the side surfaces of the vibrating body, and split electrodes provided on the side surface opposite to the side surface on which the common electrode is provided, the split electrodes being spaced from one another in a width direction. The vibrating body includes a first polarized section polarized in a direction from the side surfaces having no electrodes disposed thereon toward the split electrodes, and a second polarized section polarized in a direction from the side surfaces having no electrode disposed thereon toward the common electrode.

A vibrator according to another preferred embodiment of the present invention includes a vibrating body having a substantially quadrangular prism shape and including four side surfaces extending in a longitudinal direction, a common electrode provided on substantially the entire surface of one of the side surfaces of the vibrating body, and split electrodes provided on the side surface opposite to the side surface on which the common electrode is provided, the split electrodes being spaced from one another in a width direction. The vibrating body includes a first polarized section polarized in a direction from the side surfaces having no electrode disposed thereon toward the split electrodes, and a second polarized section polarized in a direction from the split electrodes toward the common electrode in a portion other than the first polarized section.

The above-described vibrator is polarized substantially oppositely in the thickness direction of the vibrating body having no joint layer. Therefore, opposite displacements are produced in the thickness direction of the vibrating body by applying a driving signal to the split electrodes and the common electrode of the vibrating body.

A tuning-fork vibrator assembly according to another preferred embodiment of the present invention includes two of the vibrators described above that are arranged side by side and are connected by a connecting portion. The two vibrators are connected so that the split electrodes are provided on the same plane. The connecting portion is connected over a desired width to one-end portion of each of the two vibrators.

An H-type vibrator assembly according to another preferred embodiment of the present invention includes two of the vibrators described above that are arranged side by side and are connected by a connecting portion. The two vibrators are connected so that the split electrodes are provided on the same plane. The connecting portion is connected over a desired width to the approximate centers of the two vibrators.

A vibrator production method according to another preferred embodiment of the present invention includes a first step of forming an electrode on each of one principal surface and the other principal surface of a substrate, a second step of forming grooves at regular intervals in the one principal surface and the other principal surface of the substrate, a third step of forming electrodes in the grooves, a fourth step of forming additional grooves in the grooves, the additional grooves being shallower and wider than the grooves, a fifth step of applying a voltage between the electrodes formed in the grooves of the one principal surface and the electrode formed on the one principal surface, and between the electrodes formed in the grooves of the other principal surface and the electrode formed on the other principal surface so as to produce polarization from the electrodes formed in the grooves of the one principal surface toward the one principal surface and to produce polarization from the electrodes formed in the grooves of the other principal surface toward the other principal surface, a sixth step of forming split electrodes on the one principal surface, and a seventh step of cutting the substrate at the grooves.

According to this vibrator production method, a plurality of vibrators having the above-described configuration is simultaneously obtained from a single substrate.

A vibrator production method according to another preferred embodiment of the present invention includes a first step of forming an electrode on each of one principal surface and the other principal surface of a substrate, a second step of polarizing the substrate from the one principal surface toward the other principal surface, a third step of forming grooves at regular intervals in the one principal surface of the substrate, a fourth step of forming electrodes in the grooves, a fifth step of forming additional grooves in the grooves, the additional grooves being shallower and wider than the grooves, a sixth step of applying a voltage between the electrodes formed in the grooves and the electrode formed on the one principal surface so as to produce polarization from the electrodes formed in the grooves toward the one principal surface, a seventh step of forming split electrodes on the one principal surface, and an eighth step of cutting the substrate at the grooves.

According to this vibrator production method, a plurality of vibrators having the above-described configuration is simultaneously obtained from a single substrate. Moreover, when the grooves are formed at regular intervals in the one principal surface of the substrate, the ratio of a section in which polarization is reversed can be adjusted by adjusting the depth of the grooves.

A tuning-fork vibrator assembly production method according to another preferred embodiment of the present invention includes a first step of forming an electrode on each of one principal surface and the other principal surface of a substrate, a second step of forming grooves at regular intervals in the one principal surface and the other principal surface of the substrate, a third step of forming electrodes in the grooves, a fourth step of forming additional grooves in the grooves, the additional grooves being shallower and wider than the grooves, a fifth step of applying a voltage between the electrodes formed in the grooves of the one principal surface and the electrode formed on the one principal surface, and between the electrodes formed in the grooves of the other principal surface and the electrode formed on the other principal surface so as to produce polarization from the electrodes formed in the grooves of the one principal surface toward the one principal surface and to produce polarization from the electrodes formed in the grooves of the other principal surface toward the other principal surface, a sixth step of forming split electrodes on the one principal surface, a seventh step of cutting the substrate at every other groove so as to form substrate pieces, and an eighth step of cutting each of the substrate pieces at the groove with one-end portion thereof remaining so that two vibrators and a connecting portion for connecting one-end portions of the two vibrators are formed.

A tuning-fork vibrator assembly production method according to another preferred embodiment of the present invention includes a first step of forming an electrode on each of one principal surface and the other principal surface of a substrate, a second step of polarizing the substrate from the one principal surface toward the other principal surface, a third step of forming grooves at regular intervals in the one principal surface of the substrate, a fourth step of forming electrodes in the grooves, a fifth step of forming additional grooves in the grooves, the additional grooves being shallower and wider than the grooves, a sixth step of applying a voltage between the electrodes formed in the grooves of the one principal surface and the electrode formed on the one principal surface so as to produce polarization from the electrodes formed in the grooves toward the one principal surface, a seventh step of forming split electrodes on the one principal surface; an eighth step of cutting the substrate at every other groove so as to form substrate pieces, and a ninth step of cutting each of the substrate pieces at the groove with one-end portion thereof remaining so that two vibrators and a connecting portion for connecting one-end portions of the two vibrators are formed.

An H-type vibrator assembly production method according to another preferred embodiment of the present invention includes a first step of forming an electrode on each of one principal surface and the other principal surface of a substrate, a second step of forming grooves at regular intervals in the one principal surface and the other principal surface of the substrate, a third step of forming electrodes in the grooves, a fourth step of forming additional grooves in the grooves, the additional grooves being shallower and wider than the grooves, a fifth step of applying a voltage between the electrodes formed in the grooves of the one principal surface and the electrode formed on the one principal surface, and between the electrodes formed in the grooves of the other principal surface and the electrode formed on the other principal surface so as to produce polarization from the electrodes formed in the grooves of the one principal surface toward the one principal surface and to produce polarization from the electrodes formed in the grooves of the other principal surface toward the other principal surface, a sixth step of forming split electrodes on the one principal surface, a seventh step of cutting the substrate at every other groove so as to form substrate pieces, and an eighth step of cutting each of the substrate pieces at the groove with a center portion thereof remaining so that two vibrators and a connecting portion for connecting the center portions of the two vibrators are formed.

A H-type vibrator assembly production method according to another preferred embodiment of the present invention includes a first step of forming an electrode on each of one principal surface and the other principal surface of a substrate, a second step of polarizing the substrate from the one principal surface toward the other principal surface, a third step of forming grooves at regular intervals in the one principal surface of the substrate, a fourth step of forming electrodes in the grooves, a fifth step of forming additional grooves in the grooves, the additional grooves being shallower and wider than the grooves, a sixth step of applying a voltage between the electrodes formed in the grooves of the one principal surface and the electrode formed on the one principal surface so as to produce polarization from the electrodes formed in the grooves toward the one principal surface, a seventh step of forming split electrodes on the one principal surface, an eighth step of cutting the substrate at every other groove so as to form substrate pieces, and a ninth step of cutting each of the substrate pieces at the groove with a center portion thereof remaining so that two vibrators and a connecting portion for connecting the center portions of the two vibrators are formed.

According to preferred embodiments of the present invention, since the vibrating body does not have a joint layer, a step of joining two piezoelectric substrates, as in the related art, is not required. This facilitates the production process and reduces the cost.

The vibrator according to preferred embodiments of the present invention includes sections polarized in opposite directions on both sides of the single vibrating body in the thickness direction. Therefore, displacements in opposite directions are produced on both sides of the vibrating body in the thickness direction by applying a driving signal to the split electrodes and the common electrode. As a result, the electromechanical coefficient is increased.

Further, since the vibrator does not have a joint layer, the state of the dielectric layer does not change in accordance with temperature change, and thus, a decreased detection sensitivity caused by such a change is prevented.

In the production methods according to preferred embodiments of the present invention, the use of the electrodes provided in the grooves enables sections polarized in different directions to be respectively formed on both sides of the single vibrating body in the thickness direction.

Therefore, a plurality of vibrators having the configuration according to preferred embodiments of the present invention can be obtained from a single substrate.

Further, with the production methods according to preferred embodiments of the present invention, vibrators, such as a tuning-fork vibrator and an H-type vibrator, can be easily produced with the above-described vibrator production method.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
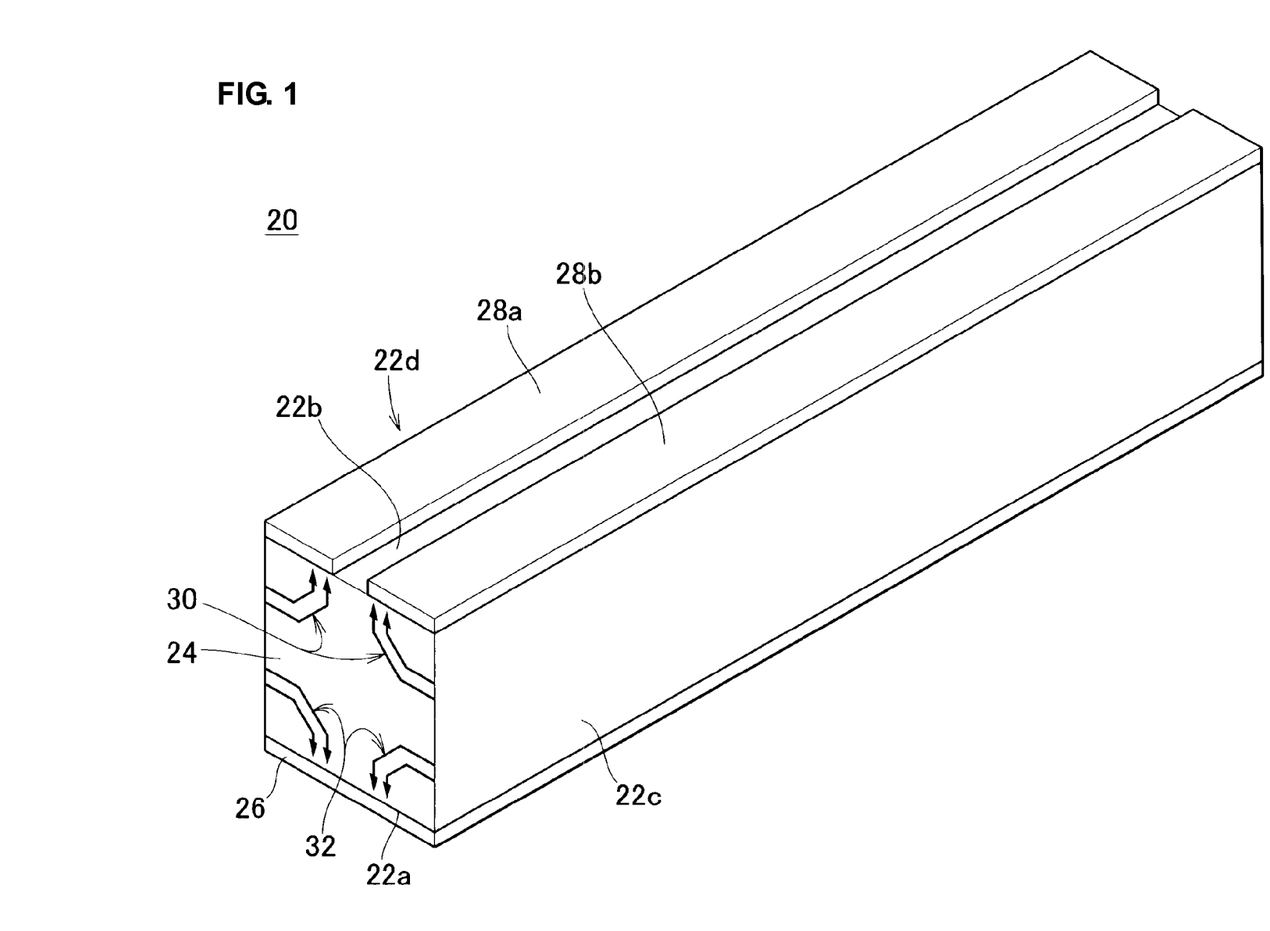
FIG. 1 is a perspective view illustrating a vibrator according to a preferred embodiment of the present invention.

FIG. 1 is a perspective view illustrating a vibrator according to a preferred embodiment of the present invention.

A vibrator 20 includes a vibrating body 24 having a substantially quadrangular prism shape, and including four side surfaces 22a, 22b, 22c, and 22d that extend in the longitudinal direction. A common electrode 26 is provided on substantially the entire side surface 22a of the vibrating body 24. Split electrodes 28a and 28b extend in the longitudinal direction on the side surface 22b opposite to the side surface 22a including the common electrode 26, and are spaced apart from each other at the widthwise center of the side surface 22b.

The vibrating body 24 includes a first polarized section 30 and a second polarized section 32. The first polarized section 30 is polarized from the side surfaces 22c and 22d of the vibrating body 24, on which an electrode is not provided, toward the side surface 22b on which the split electrodes 28a and 28b are provided. The second polarized section 32 is polarized from the side surfaces 22c and 22d of the vibrating body 24, on which an electrode is not provided, toward the side surface 22a on which the common electrode 26 is provided.

FIGS. 2A to 2D are cross-sectional views illustrating a production method for the vibrator 20.

Figure 2A:
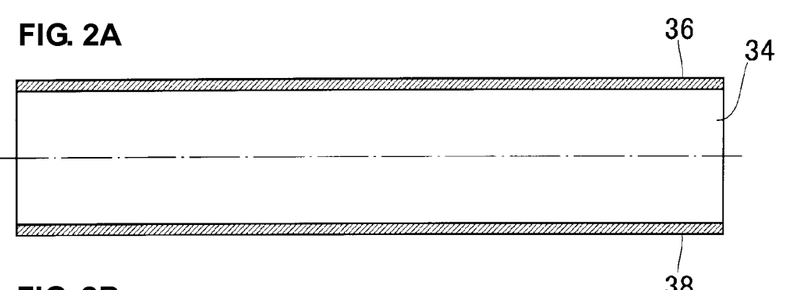
FIGS. 2A to 2D are explanatory views showing a production method for producing the vibrator shown in FIG. 1.

In order to produce this vibrator 20, a substrate 34 is first prepared.

Full surface electrodes 36 and 38 are respectively formed on one principal surface and the other principal surface of the substrate 34, as shown in FIG. 2A.

Figure 2B:
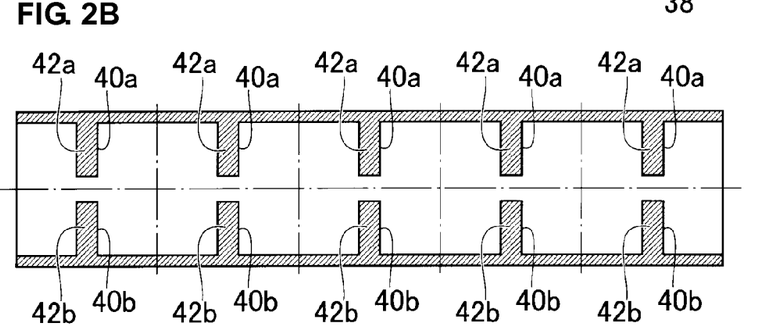

As shown in FIG. 2B, first grooves 40a and 40b are respectively formed substantially in parallel and at regular intervals in the one principal surface and the other principal surface of the substrate 34. The first grooves 40a and 40b oppose each other. Electrodes 42a and 42b are respectively formed in the first grooves 40a and 40b provided in the one principal surface and the other principal surface of the substrate 34. As a result, the full surface electrodes 36 and 38 are connected to the electrodes 42a and 42b. While the first grooves 40a and 40b are completely filled with the electrodes 42a and 42b with no clearance in FIG. 2B, other configurations may be provided as long as the electrodes 42a and 42b are entirely in contact with side surfaces and bottom surfaces of the first grooves 40a and 40b.

Figure 2C:
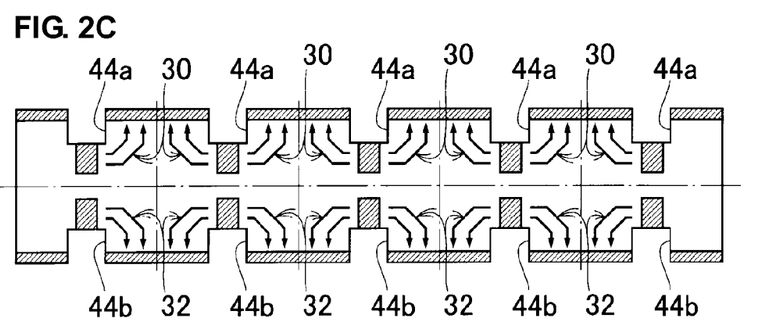

As shown in FIG. 2C, second grooves 44a and 44b that are wider and shallower than the first grooves 40a and 40b are formed at the electrodes 42a and 42b provided in the first grooves 40a and 40b. As a result, the full surface electrodes 36 and 38 are separated from the electrodes 42a and 42b.

By applying a voltage between the electrodes 42a formed in the first grooves 40a of the one principal surface of the substrate 34 and the full surface electrode 36 formed on the one principal surface, and between the electrodes 42b formed in the first grooves 40b of the other principal surface of the substrate 34 and the full surface electrode 38 formed on the other principal surface, first polarized sections 30 and second polarized sections 32 are formed in opposite thickness directions, as shown by the arrows in FIG. 2C.

Figure 2D:
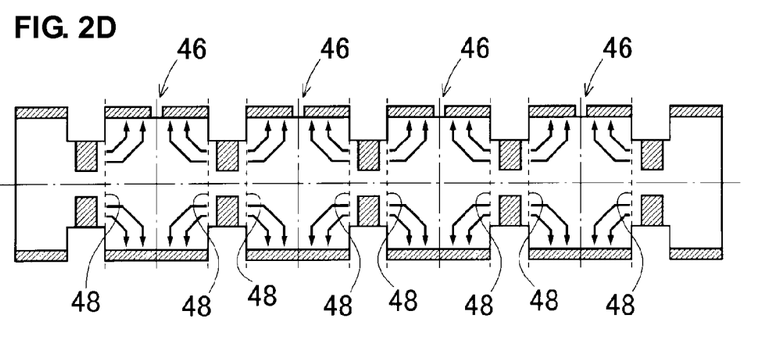

In FIG. 2D, split electrodes 28a and 28b are formed by cutting portions of the full surface electrode 36 on the one principal surface of the substrate 34 along center lines 46 between the grooves 44a. Subsequently, the substrate 34 is cut along the second wide grooves 44a and 44b, as shown by dotted lines 48 in FIG. 2D, so that a plurality of vibrators 20 are formed. In this preferred embodiment, the electrodes 42a and 42b in the first grooves 40a and 40b are removed.

Since this vibrator 20 does not include a joint layer, a step of bonding the substrates via the joint layer is not required. This facilitates the production process and reduces the cost. Further, since the vibrator 20 includes the vibrating body 24 polarized in opposite thickness directions, bimorph vibration is generated by the application of a driving signal to the split electrodes 28a and 28b and the common electrode 26. Therefore, a vibrator 20 having a high electromechanical coefficient is obtained.

According to the above-described production method for the vibrator 20, by applying a voltage between the electrodes 42a formed in the first grooves 40a and the full surface electrode 36, and between the electrodes 42b formed in the first grooves 40b and the full surface electrode 38, the first polarized section 30 and the second polarized section 32 polarized in different directions are formed so that the first polarized section 30 is located on one side of the single vibrating body 24 in the thickness direction and the second polarized section 32 is located on the other side. Moreover, a large number of vibrators 20 can be simultaneously produced from a single plate.

Figure 3:
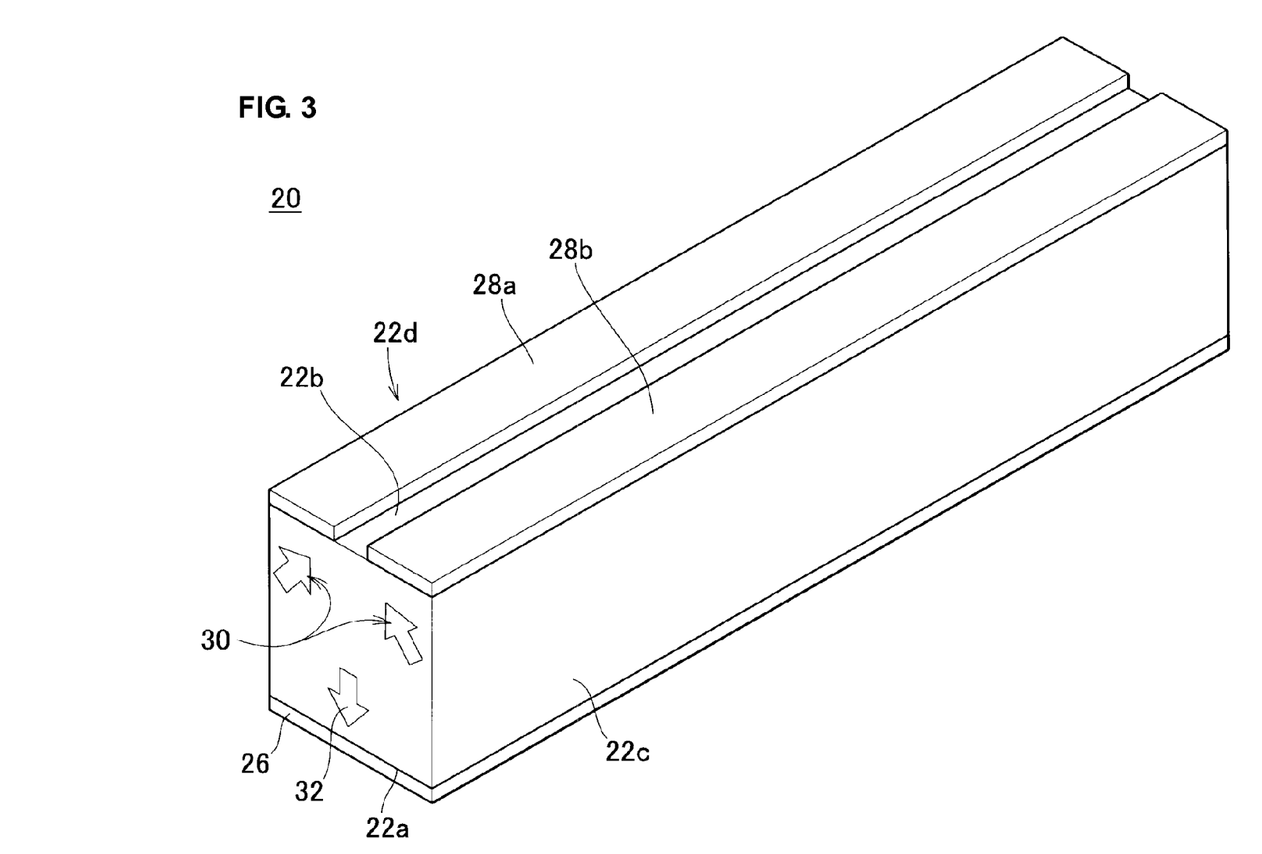
FIG. 3 is a perspective view illustrating a vibrator according to another preferred embodiment of the present invention.

FIG. 3 is a perspective view illustrating a vibrator according to another preferred embodiment of the present invention.

A vibrator 50 includes a vibrating body 24 having a substantially quadrangular prism shape and including four side surfaces 22a, 22b, 22c, and 22d extending in the longitudinal direction. A common electrode 26 is provided on substantially the entire side surface 22a of the vibrating body 24. Split electrodes 28a and 28b extend in the longitudinal direction on the side surface 22b opposite to the side surface 22a on which the common electrode 26 is provided, and are spaced from one another at the widthwise center of the side surface 22b.

The vibrating body 24 includes a first polarized section 30 and a second polarized section 32. The first polarized section 30 is formed so as to be polarized from the side surfaces 22c and 22d of the vibrating body 24, on which an electrode is not provided, toward the side surface 22b on which the split electrodes 28a and 28b are provided. The second polarized section 32 is formed in a portion of the vibrating body 24 other than the first polarized section 30, and is polarized from the side surface 22b having the split electrodes 28a and 28b toward the side surface 22a on which the common electrode 26 is provided.

FIGS. 4A to 4E include cross-sectional views illustrating a production method for the vibrator 50.

Figure 4A:
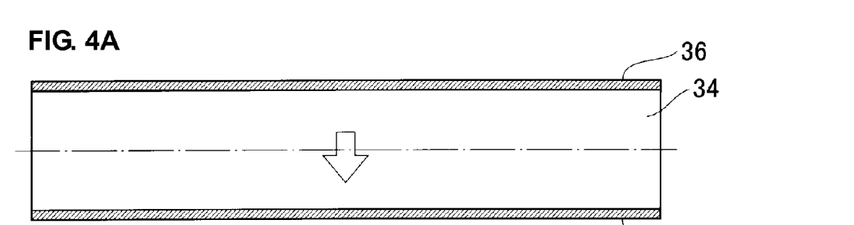
FIGS. 4A to 4E are explanatory views showing a production method for producing the vibrator shown in FIG. 3.

In order to produce this vibrator 50, a substrate 34 is first prepared.

As shown in FIG. 4A, full surface electrodes 36 and 38 are respectively formed on one principal surface and the other principal surface of the substrate 34. As shown by the arrow in FIG. 4A, the substrate 34 is polarized entirely in the thickness direction, that is, from the one principal surface to the other principal surface of the substrate 34.

Figure 4B:
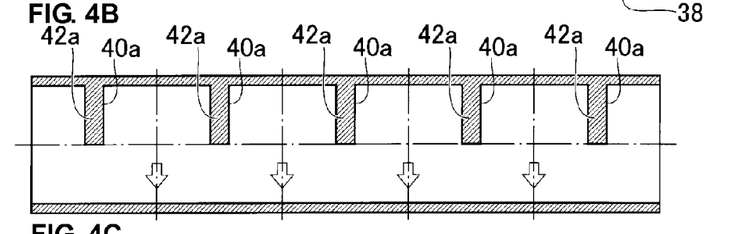

First grooves 40a are formed at regular intervals and substantially in parallel in the one principal surface of the substrate 34, as shown in FIG. 4B. Electrodes 42a are formed in the first grooves 40a formed in the one principal surface of the substrate 34. As a result, the full surface electrode 36 is connected to the electrodes 42a. While the first grooves 40a are completely filled with the electrodes 42a with no clearance in FIG. 4B, other configurations may be provided as long as the electrodes 42a are entirely in contact with side and bottom surfaces of the first grooves 40a.

Figure 4C:
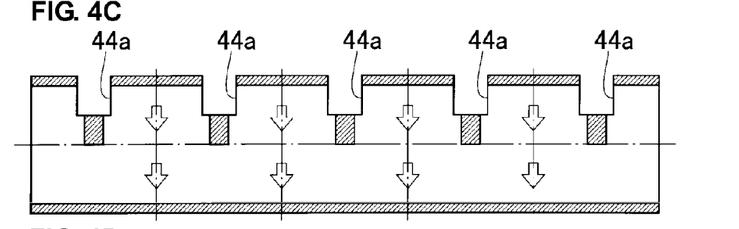

Subsequently, as shown in FIG. 4C, second grooves 44a that are wider and shallower than the first grooves 40a formed in the one principal surface of the substrate 34 are formed at the electrodes 42a provided in the first grooves 40a. As a result, the full surface electrode 36 is separated from the electrodes 42a.

Figure 4D:
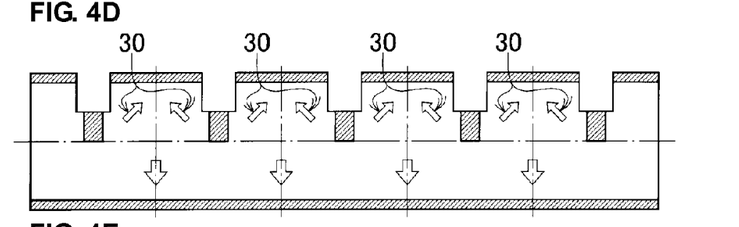

First polarized sections 30 are formed by applying a voltage between the electrodes 42a provided in the first grooves 40a of the one principal surface of the substrate 34 and the full surface electrode 36 on the one principal surface, as shown by the arrows in FIG. 4D. The polarization of the substrate 34 remains in a portion of the substrate 34 other than the first polarized sections 30, thereby forming second polarized sections 32.

Figure 4E:
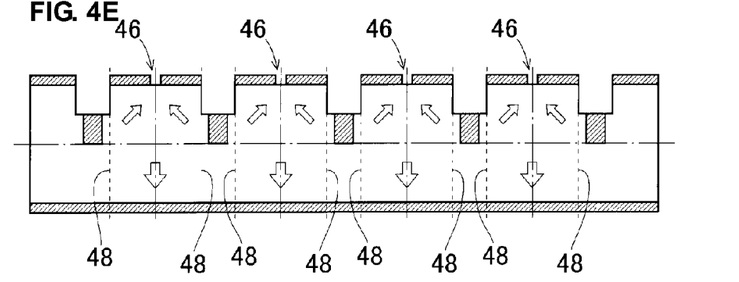

In FIG. 4E, split electrodes 28a and 28b are formed by cutting portions of the full surface electrode 36 on the one principal surface of the substrate 34 along center lines 46 between the grooves 44a. Subsequently, as shown by dotted lines 48 in FIG. 4E, the substrate 34 is cut along the wide second grooves 44a and 44b, so that a plurality of vibrators 50 is formed. In this case, the electrodes 42a in the first grooves 40a are removed.

Since this vibrator 50 does not include a joint layer either, a step of bonding the substrates via the joint layer is not required. This facilitates the production process and reduces the cost. Further, since the vibrator 50 includes the vibrating body 24 polarized in opposite thickness directions, bimorph vibration is generated by the application of a driving signal to the split electrodes 28a and 28b and the common electrode 26. Therefore, the vibrator 50 having a high electromechanical coefficient is obtained.

Further, according to the above-described production method for the vibrator 50, after polarization is performed in the thickness direction of the vibrating body 24 by applying a voltage between the full surface electrode 36 and the full surface electrode 38, a voltage is applied between the electrodes 42a provided in the first grooves 40a and the full surface electrode 36. Consequently, the first polarized section 30 and the second polarized section 32 polarized in different directions can be formed so that the first polarized section 30 lies on one side of the single vibrating body 24 in the thickness direction and the second polarized section 32 lies on the other side.

According to the production method for the vibrator 50, the range of the first polarized section 30 can be controlled by adjusting the depth of the first groove 40a, and the bimorph vibration state of the vibrator can be controlled thereby. Moreover, a large number of vibrators 50 are simultaneously obtained from a single plate.

Figure 5:
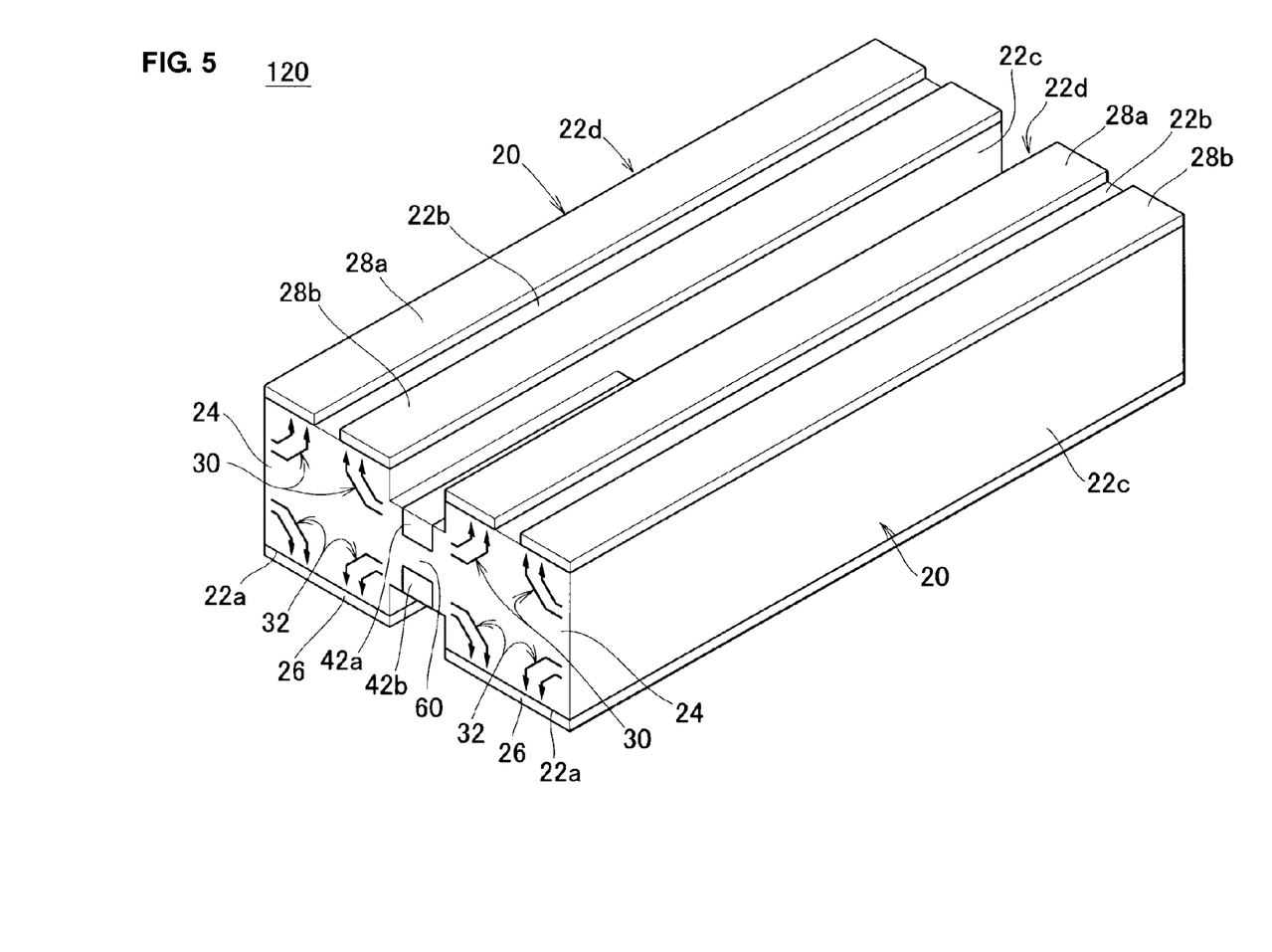
FIG. 5 is a perspective view illustrating a tuning-fork vibrator assembly according to a preferred embodiment of the present invention.

FIG. 5 is a perspective view illustrating a tuning-fork vibrator assembly according to a preferred embodiment of the present invention.

A tuning-fork vibrator assembly 120 includes two vibrators 20 arranged side by side. These vibrators 20 are connected at one end by a connecting portion 60 so as to define a tuning fork. The two vibrators 20 have a structure that is similar to that of the vibrator 20 shown in FIG. 1, and the connecting portion 60 is made of the same material as that of the vibrating body 24 that defines the vibrator 20. Electrodes 42a and 42b are provided in opposite portions of the connecting portion 60, and extend along the two vibrators 20. These electrodes 42a and 42b remain in a production process for the tuning-fork vibrator assembly 120, and are not pertinent to the operation of the tuning-fork vibrator assembly 120.

A description will now be given of a production method for producing the tuning-fork vibrator assembly 120.

Figure 6:
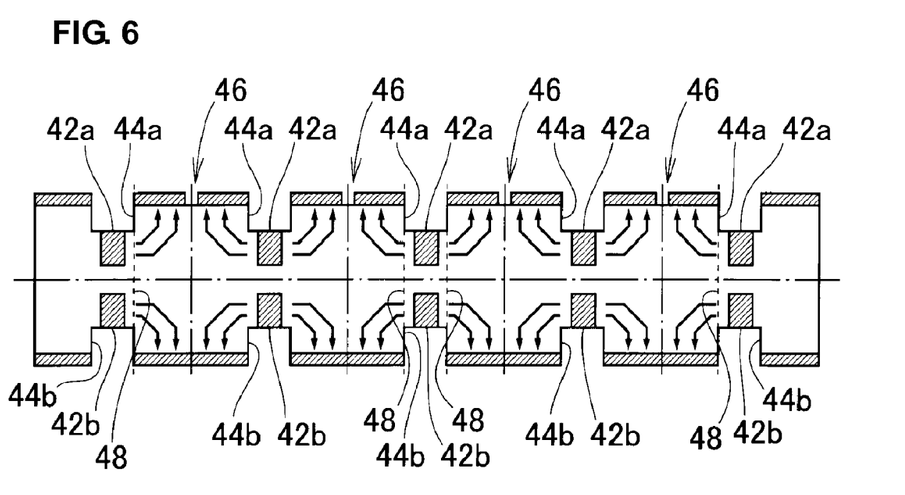
FIG. 6 is an explanatory view showing a production method for producing the tuning-fork vibrator assembly shown in FIG. 5.

The production method for the tuning-fork vibrator assembly 120 includes the steps shown in FIGS. 2A to 2D, and a polarized substrate 34 is formed. Then, as shown in FIG. 6, split electrodes 28a and 28b are formed by cutting portions of a full surface electrode on one principal surface of the substrate 34 along center lines 46 between grooves 44a in the full surface electrode. Subsequently, as shown by dotted lines 48 in FIG. 6, the substrate 34 is cut at every other groove, so that a plurality of substrate pieces each having a center groove are formed. Each substrate piece that is obtained is cut at the groove so as to leave the portion located at one end side of the substrate. Consequently, two vibrators 20 and a connecting portion 60 are formed, and a tuning-fork vibrator assembly 120 is obtained thereby.

Figure 7:
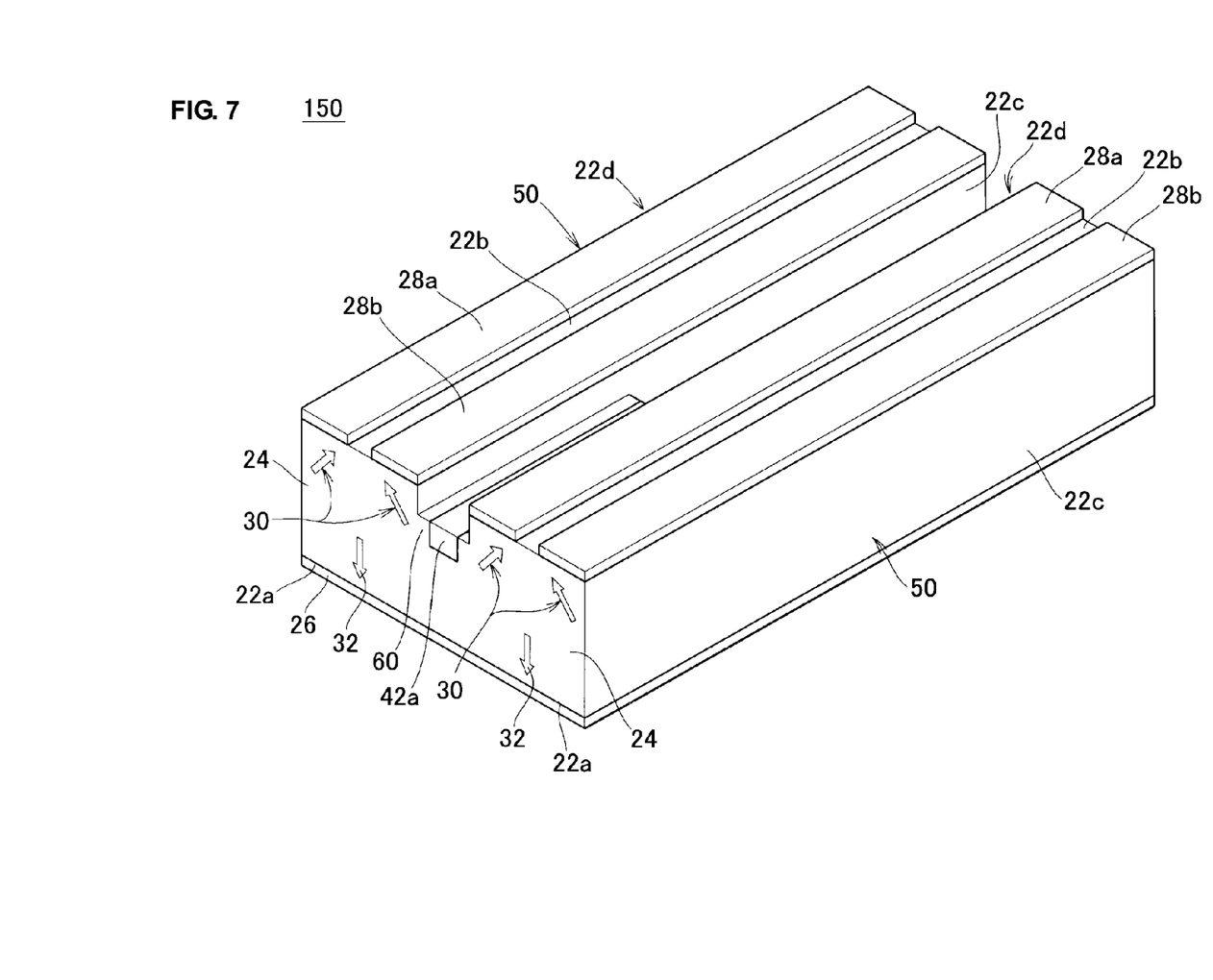
FIG. 7 is a perspective view of another tuning-fork vibrator assembly according to a preferred embodiment of the present invention.

FIG. 7 is a perspective view illustrating a tuning-fork vibrator assembly according to another preferred embodiment of the present invention.

A tuning-fork vibrator assembly 150 includes two vibrators 50 arranged side by side. These vibrators 50 are connected at one end by a connecting portion 60 so as to form a tuning fork. The two vibrators 50 have a structure similar to that of the vibrator 50 shown in FIG. 3, and the connecting portion 60 is made of the same material as that of the vibrating body 24 that defines the vibrator 50. An electrode 42a is provided in opposite portions of the connecting portion 60, and extends along the two vibrators 50. The electrode 42a remains in a production process for the tuning-fork vibrator assembly 150, and is not pertinent to the operation of the tuning-fork vibrator assembly 150.

A description will be given of a production method for producing the tuning-fork vibrator assembly 150.

Figure 8:
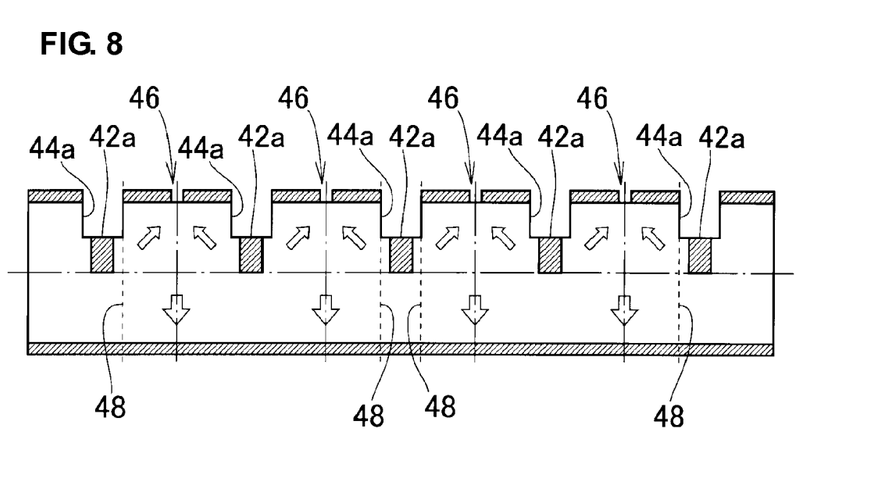
FIG. 8 is an explanatory view showing a production method for producing the tuning-fork vibrator assembly shown in FIG. 7.

The production method for the tuning-fork vibrator assembly 150 includes the steps shown in FIGS. 4A to 4D, and a polarized substrate 34 is formed. Subsequently, as shown in FIG. 8, split electrodes 28a and 28b are formed by cutting portions of a full surface electrode on one principal surface of the substrate 34 along center lines 46 between grooves 44a provided in the one principal surface. Then, the substrate 34 is cut at every other groove, as shown by dotted lines 48 in FIG. 8, so that a plurality of substrate pieces each having a center groove are formed. Each substrate piece thus obtained is cut at the groove so as to leave the portion located at one end side of the substrate piece. Consequently, two vibrators 50 and a connecting portion 60 are formed, and a tuning-fork vibrator assembly 150 is obtained.

Figure 9:
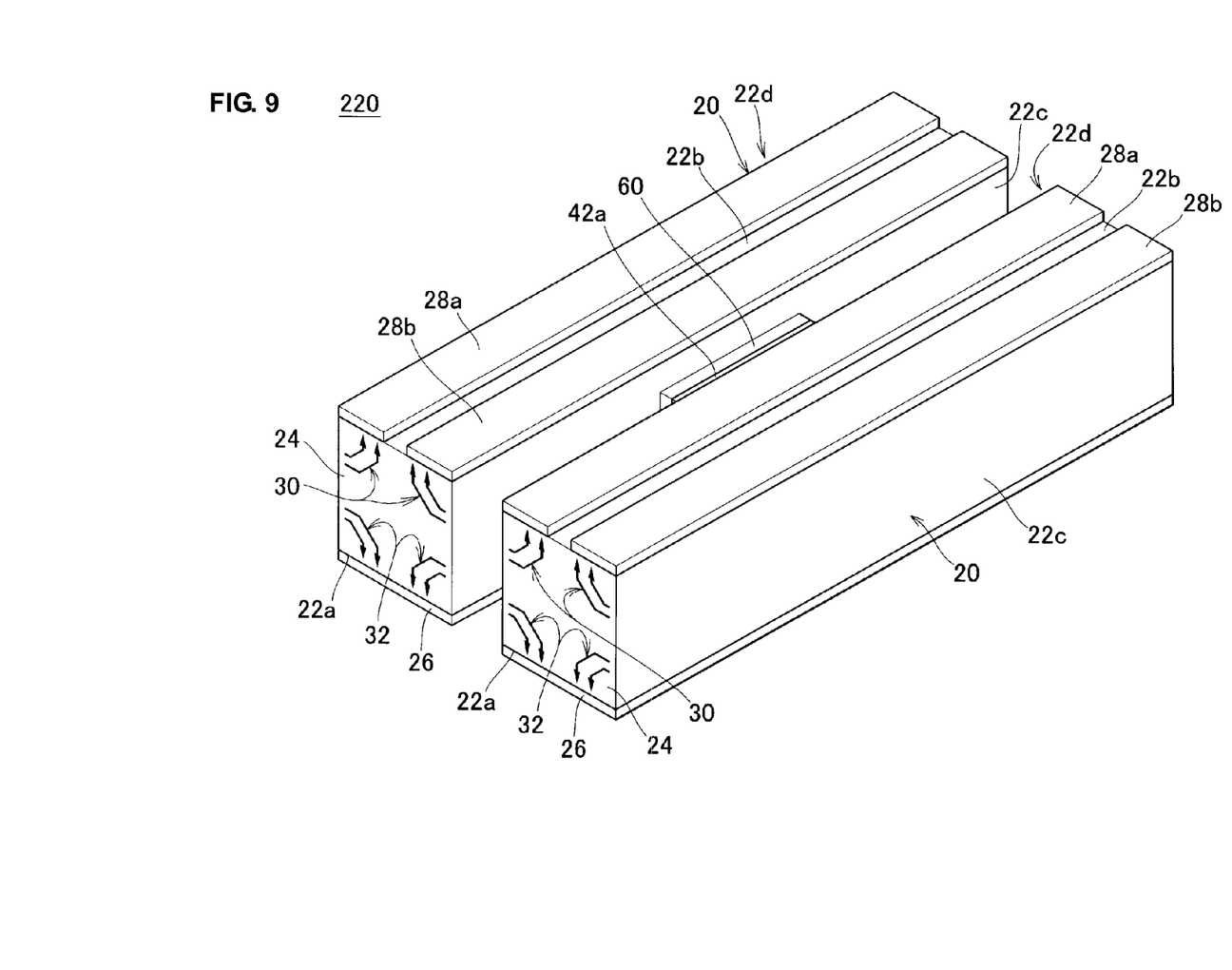
FIG. 9 is a perspective view illustrating an H-type vibrator assembly according to a preferred embodiment of the present invention.

FIG. 9 is a perspective view illustrating an H-type vibrator assembly according to a preferred embodiment of the present invention.

An H-type vibrator assembly 220 includes two vibrators 20 arranged side by side. These vibrators 20 are connected at a center portion by a connecting portion 60 so as to form an H-shape. The two vibrators 20 have a structure similar to that of the vibrator 20 shown in FIG. 1, and the connecting portion 60 is made of the same material as that of the vibrating body 24 that defines the vibrator 20. Electrodes 42a and 42b are provided in opposite portions of the connecting portion 60, and extend along the two vibrators 20. The electrodes 42a and 42b remain in a production process for the H-type vibrator assembly 220, and are not pertinent to the operation of the H-type vibrator assembly 220.

A description will be given of a production method for the H-type vibrator assembly 220.

The production method for the H-type vibrator assembly 220 includes the steps shown in FIGS. 2A to 2D, and a polarized substrate 34 is formed. Subsequently, as shown in FIG. 6, split electrodes 28a and 28b are formed by cutting portions of a full surface electrode on one principal surface of the substrate 24 along center lines 46 between grooves 44a provided in the one principal surface. Then, the substrate 34 is cut at every other groove, as shown by dotted lines 48 in FIG. 6, so that a plurality of substrate pieces each having s center groove are formed. Each substrate piece that is obtained is cut at the groove so as to leave the portion located at the center portion of the substrate piece. Consequently, two vibrators 20 and a connecting portion 60 are formed, and an H-type vibrator assembly 220 is obtained.

Figure 10:
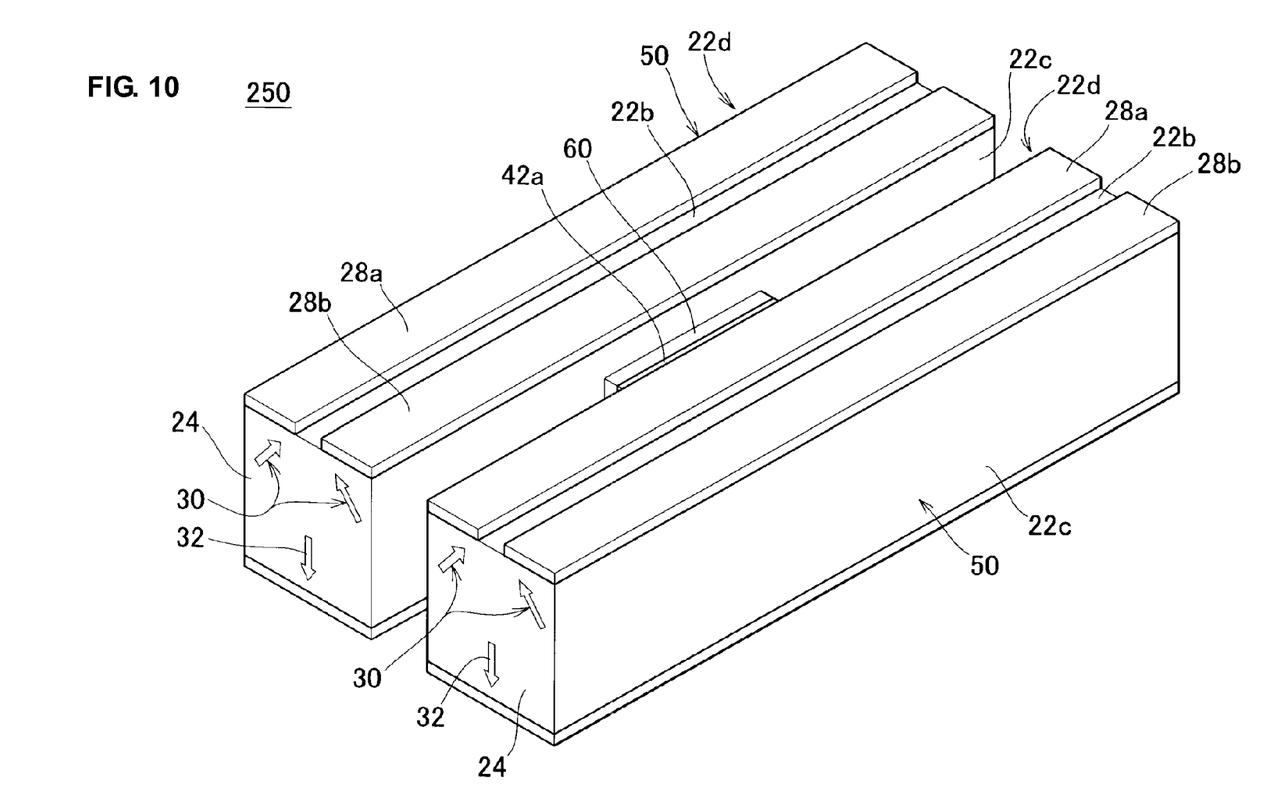
FIG. 10 is a perspective view illustrating an H-type vibrator assembly according to another preferred embodiment of the present invention.

FIG. 10 is a perspective view illustrating an H-type vibrator assembly according to another preferred embodiment of the present invention.

An H-type vibrator assembly 250 includes two vibrators 50 arranged side by side. These vibrators 50 are connected at a center portion by a connecting portion 60 so as to form an H-shape. The two vibrators 50 have a structure similar to that of the vibrator 50 shown in FIG. 3, and the connecting portion 60 is made of the same material as that of the vibrating body 24 that defines the vibrator 50. An electrode 42a is provided in one of opposite portions of the connecting portion 60, and extends along the two vibrators 50. The electrode 42a remains in a production process for the H-type vibrator assembly 250, and is not pertinent to the operation of the H-type vibrator assembly 250.

A description will now be given of a production method for the H-type vibrator assembly 250.

The production method for the H-type vibrator assembly 250 includes the steps shown in FIGS. 4A to 4D, and a polarized substrate 34 is formed. Subsequently, as shown in FIG. 8, split electrodes 28a and 28b are formed by cutting portions of a full surface electrode on one principal surface of the substrate 34 along center lines 46 between grooves 44a provided in the one principal surface. Then, the substrate 34 is cut at every other groove, as shown by dotted lines 48 in FIG. 8, so that a plurality of substrate pieces each having a center groove are formed. Each substrate piece that is obtained is cut at the groove so as to leave the portion located at the center portion of the substrate piece. Consequently, two vibrators 50 and a connecting portion 60 are formed, and an H-type vibrator assembly 250 is obtained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A vibrator comprising:
   a vibrating body having a substantially quadrangular prism shape and including four side surfaces extending in a longitudinal direction of the vibrating body;
   a common electrode provided on substantially an entire surface of one of the side surfaces of the vibrating body; and
   split electrodes provided on the side surface opposite to the side surface on which the common electrode is provided, the split electrodes being spaced from each other in a width direction; wherein
   the vibrating body includes a first polarized section polarized in a direction from the side surfaces having no electrode disposed thereon toward the split electrodes, and a second polarized section polarized in a direction from the side surfaces having no electrode disposed thereon toward the common electrode.

2. A vibrator comprising:
   a vibrating body having a substantially quadrangular prism shape and including four side surfaces extending in a longitudinal direction of the vibrating body;
   a common electrode provided on substantially an entire surface of one of the side surfaces of the vibrating body; and
   split electrodes provided on the side surface opposite to the side surface on which the common electrode is provided, the split electrodes being spaced from each other in a width direction; wherein
   the vibrating body includes a first polarized section polarized in a direction from the side surfaces having no electrode disposed thereon toward the split electrodes, and a second polarized section polarized in a direction from the split electrodes toward the common electrode in a portion other than the first polarized section.

3. A tuning-fork vibrator assembly comprising:
   a connecting portion; and
   at least two vibrators according to claim 1 arranged side by side and connected by the connecting portion; wherein
   the at least two vibrators are connected so that the split electrodes are located on the same plane; and
   the connecting portion is connected to end portions of the at least two vibrators.

4. A tuning-fork vibrator assembly comprising:
   a connecting portion; and
   at least two vibrators according to claim 2 arranged side by side and connected by the connecting portion; wherein
   the at least two vibrators are connected so that the split electrodes are located on the same plane; and
   the connecting portion is connected along a width to end portions of the at least two vibrators.

5. An H-type vibrator assembly comprising:
   a connecting portion; and
   at least two vibrators according to claim 1 arranged side by side and connected by the connecting portion; wherein
   the at least two vibrators are connected so that the split electrodes are located on the same plane; and
   the connecting portion is connected along a width to approximate center portions of the at least two vibrators.

6. An H-type vibrator assembly comprising:
   a connecting portion; and
   at least two vibrators according to claim 2 arranged side by side and connected by the connecting portion; wherein
   the at least two vibrators are connected so that the split electrodes are located on the same plane; and
   the connecting portion is connected along a width to approximate center portions of the at least two vibrators.

* * * * *